US012585183B2

(12) United States Patent
Mayorga Martínez et al.

(10) Patent No.: US 12,585,183 B2
(45) Date of Patent: Mar. 24, 2026

(54) METHOD OF FORMING AN ELECTRONIC DEVICE ON A FLEXIBLE SUBSTRATE

(71) Applicants: FUNDACIÓ INSTITUT CATALÀ DE NANOCIÈNCIA I NANOTECNOLOGIA, Bellaterra (ES); INSTITUCIÓ CATALANA DE RECERCA I ESTUDIS AVANÇATS, Barcelona (ES)

(72) Inventors: Carmen Clotilde Mayorga Martínez, Singapore (SG); Luis Miguel Baptista Pires, Barcelona (ES); Arben Merkoçi Hyka, Cerdanyola del Vallès (ES)

(73) Assignees: FUNDACIÓ INSTITUT CATALÀ DE NANOCIÈNCIA I NANOTECNOLOGIA, Bellaterra (ES); INSTITUCIÓ CATALANA DE RECERCA I ESTUDIS AVANÇATS, Barcelona (ES)

( * ) Notice: Subject to any disclaimer, the term of this patent is extended or adjusted under 35 U.S.C. 154(b) by 398 days.

(21) Appl. No.: 15/319,733

(22) PCT Filed: Jun. 19, 2015

(86) PCT No.: PCT/EP2015/063842
§ 371 (c)(1),
(2) Date: Dec. 16, 2016

(87) PCT Pub. No.: WO2015/193486
PCT Pub. Date: Dec. 23, 2015

(65) Prior Publication Data
US 2017/0123310 A1    May 4, 2017

(30) Foreign Application Priority Data
Jun. 20, 2014    (EP) ..................................... 14382240

(51) Int. Cl.
*G03F 7/00* (2006.01)
*B01D 67/00* (2006.01)
(Continued)

(52) U.S. Cl.
CPC ....... *G03F 7/0002* (2013.01); *B01D 67/0034* (2013.01); *B01D 71/0211* (2022.08);
(Continued)

(58) Field of Classification Search
CPC .......... B41J 2/315; G03F 7/0002; G03F 1/50; H05K 3/1278; B01D 69/02; B01D 71/0211
See application file for complete search history.

(56) References Cited

U.S. PATENT DOCUMENTS

2007/0065977 A1* 3/2007 Rinzler .................. B82Y 10/00
                                                    438/99
2009/0311489 A1* 12/2009 Sheehan ................ B82Y 10/00
                                                    428/195.1
(Continued)

FOREIGN PATENT DOCUMENTS

EP            2583941 A1      4/2013
WO   WO 2004/009884 A1       1/2004
WO   WO 2007/035838 A2       3/2007

OTHER PUBLICATIONS

Goki Eda et al, Nature Nanotech. vol. 3 May (Year: 2008).*
(Continued)

*Primary Examiner* — Tabassom Tadayyon Eslami
(74) *Attorney, Agent, or Firm* — Sughrue Mion, PLLC

(57) ABSTRACT

A method of forming an electronic device on a flexible substrate without using acetone dissolvent, including the steps of: printing a hydrophobic mask on a porous membrane to form a pattern thereon which is complementary to a desired pattern; filtering an aqueous suspension of an
(Continued)

electronic material through the non-printed region of the porous membrane, whereby some electronic material is deposited on said non-printed region following the desired pattern; pressing the flexible substrate against the printed face of the membrane in order to transfer the patterned electronic material deposited on the porous membrane to the flexible substrate to form the electronic device thereon.

16 Claims, 4 Drawing Sheets

(51) Int. Cl.

| | |
|---|---|
| *B01D 71/02* | (2006.01) |
| *B01D 71/12* | (2006.01) |
| *H05K 1/189* | (2026.01) |
| *H05K 3/00* | (2006.01) |
| *H05K 3/12* | (2006.01) |
| *B01D 69/02* | (2006.01) |

(52) U.S. Cl.
CPC ............. *B01D 71/12* (2013.01); *H05K 1/189* (2013.01); *H05K 3/0076* (2013.01); *H05K 3/1275* (2013.01); *B01D 69/02* (2013.01); *H05K 2201/0145* (2013.01); *H05K 2203/0736* (2013.01)

(56) References Cited

U.S. PATENT DOCUMENTS

| | | | | |
|---|---|---|---|---|
| 2010/0056819 | A1* | 3/2010 | Jang | B82Y 30/00 556/478 |
| 2010/0127242 | A1* | 5/2010 | Zhou | B82Y 10/00 257/24 |
| 2010/0147188 | A1* | 6/2010 | Mamak | B82Y 30/00 106/31.13 |
| 2010/0267186 | A1* | 10/2010 | Wang | H01L 31/035281 438/71 |
| 2012/0228597 | A1* | 9/2012 | Robinson | H01L 51/5032 257/40 |
| 2014/0014400 | A1* | 1/2014 | Mori | H05K 1/0274 156/247 |

OTHER PUBLICATIONS

Applied Physics Letters 91, 243117-1 to 243117-3 (2007). (Year: 2007).*

Document: 1; https://en.wikipedia.org/wiki/Chemistry_of_photolithography (Year: NA).*

International Search Report and Written Opinion of the International Searching Authority mailed Aug. 20, 2015 for PCT/EP2015/063842, 12 pages.

Goki Eda, et al.: "Large-area ultrathin films of reduced graphene oxide as a transparent and flexible electronic material", Nature Nanotechnology, vol. 3, May 2008, pp. 270-274, 5 pages.

Yao Lu, et al.: "Fabrication and characterization of paper-based microfluidics prepared in nitrocellulose membrane by wax printing", Analytical Chemistry, vol. 82, No. 1, Jan. 1, 2010, pp. 329-335, 7 pages.

Wijitar Dungchai, et al.: "A low-cost, simple, and rapid fabrication method for paper-based microfluidics using wax screen-printing", Royal Soc. Chem. Analyst 2011, vol. 136, No. 77, pp. 77-82, 6 pages.

Vincent C. Tung et al., "Low-Temperature Solution Processing of Graphene—Carbon Nanotube Hybrid Materials for High-Performance Transparent Conductors," Nano Letters, vol. 9, No. 5, pp. 1949-1955, 2009.

Juqing Liu et al., "Multilayer Stacked Low-Temperature-Reduced Graphene Oxide Films: Preparation, Characterization, and Application in Polymer Memory Devices," Small Journal, vol. 6, No. 14, pp. 1536-1542, 2010. www.small-journal.com.

* cited by examiner (a)

(b)

(c)

(d)

(e)

(a)

(b)

101    111    121    301    201

112

112    122

102    202    302

(a)

(b)

FIG. 5
(a)
(b)
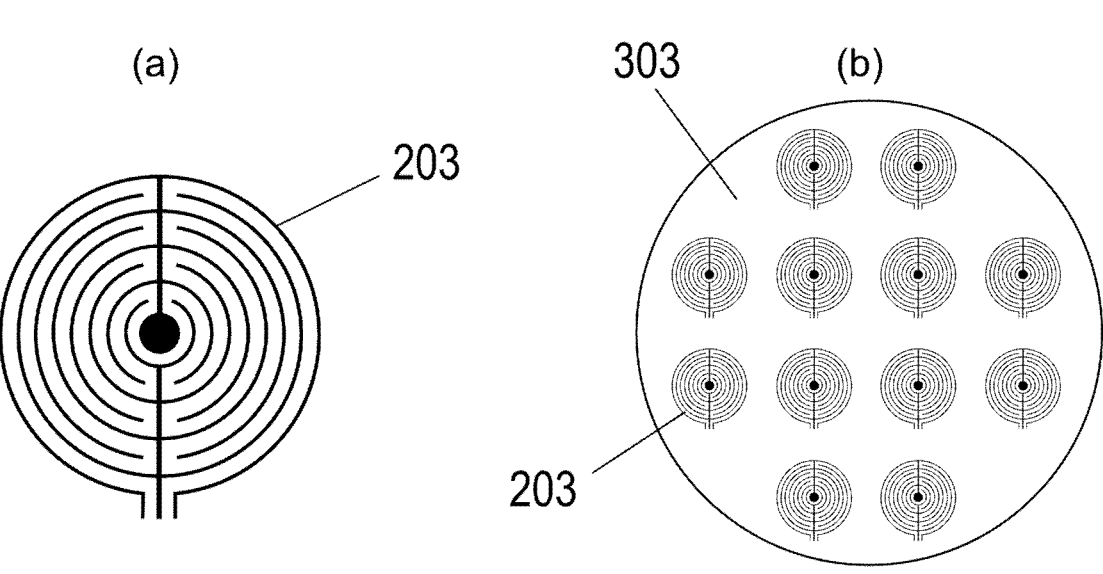
(a)
(b)
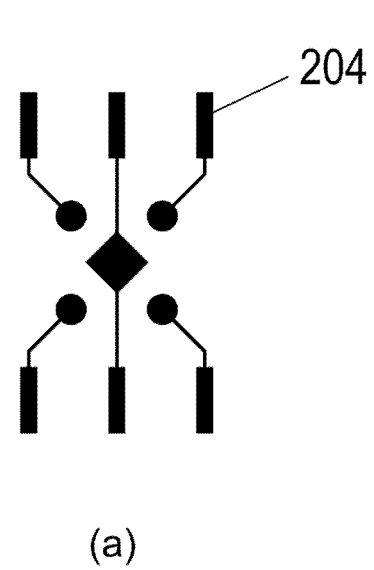
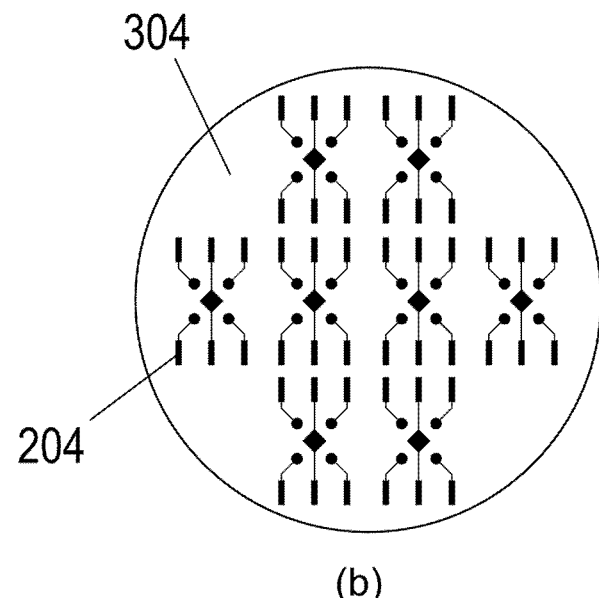
FIG. 6

METHOD OF FORMING AN ELECTRONIC DEVICE ON A FLEXIBLE SUBSTRATE

This application claims the benefit of European Patent Application No. 14382240.1, filed on Jun. 20, 2014.

FIELD OF INVENTION

The present invention is related to a method of forming an electronic device on a suitable flexible substrate and to an apparatus comprising an electronic device made with such a method. Such a device may be, for example, an electrode or an electrode array or, more generally, an electronic platform.

BACKGROUND

Devices of this kind can be used in the fabrication of solar cells, light emitting diodes (LEDs), field effect transistors (FETs), super capacitors, biosensors, etc. One interesting material for such devices is graphene oxide (GO), either oxidized (oGO) or reduced (rGO), but other materials can be used as well, like for instance gold nanoparticles, carbon nanotubes, CdSe or CdTe quantum dots, or even composite materials.

The development of oxidized graphene oxide (oGO) based platforms are driven by spin coating, self-assembly, vacuum filtration or solvent exchange, and can be patterned using nanolithography techniques, microcontacting techniques or inkjet technology. These methods involve long fabrication periods, high cost, great expertise and clean room facilities. Besides, said methods are not versatile and effective in the designing of simple devices like transistors or capacitors.

WO2007035838A2 discloses a low temperature method for producing micrometric patterns in films via a filtration process using membrane blocking, in which, prior to the film formation process, selected regions of the porous filtration membrane are blocked, so that the selected regions do not provide flow through porosity to the solution. The membrane is dissolved with acetone to leave the patterned film on a rigid substrate.

Eda et al. disclosed, in "Large-area ultrathin films of reduced graphene oxide as a transparent and flexible electronic material", Nature Nanotechnology 3, 270-274 (2008), a solution-based method that allows uniform and controllable deposition of reduced graphene oxide over large areas. Vacuum filtration involves the filtration of a GO suspension through a commercial mixed nitrocellulose ester membrane (NCM) with an average pore size of 25 nm. As the suspension is filtered through the membrane, the liquid is able to pass through the pores but the GO sheets become lodged on the membrane. Said lodged GO can be transferred by placing the membrane with the film side down and dissolving the membrane with acetone, leaving behind a uniform GO thin film.

Changing subject, Lu et al. disclosed, in "Fabrication and characterization of paper-based microfluidics prepared in nitrocellulose membrane by wax printing", Analytical Chemistry 82, 329-335 (2010), a process of wax patterning that forms hydrophobic regions in the membrane.

The present disclosure teaches ways to pattern and transfer oGO, and other suitable electronic materials, onto a flexible substrate, that combine, surpass and simplify the indicated technologies.

SUMMARY OF INVENTION

The present disclosure contemplates a method of forming an electronic device on a flexible substrate, comprising the steps of:

printing a hydrophobic mask on a porous membrane to form a pattern thereon which is complementary to a desired pattern;

filtering an aqueous suspension of an electronic material through the non-printed region of the porous membrane, whereby some electronic material is deposited on said non-printed region following the desired pattern;

pressing the flexible substrate against the printed face of the membrane in order to transfer the patterned electronic material deposited on the porous membrane to the flexible substrate to form the electronic device thereon;

wherein the method is carried out without using acetone dissolvent.

The pressing step provides an inexpensive flexible substrate with a pattern of an electronic material (e.g. graphene oxide -GO) on a surface thereof, thus forming an electronic device on a flexible substrate.

The acetone dissolvent can be dispensed with because the pressing force can be made strong enough to be successfully applied between the electronic material (e.g. a GO mesh) and the flexible target substrate. This means for the pressure to be sufficient to overcome the hydrophobic mask (which may have a height of about 25 µm in the case of wax printing) and achieve a direct contact between the GO mesh and the target substrate. The transfer of the electronic material onto the target substrate can be performed by means of, for instance, vertical pressure or roll-to-roll-like pressure. The transfer phenomena are related to the hydrophobicity of the porous membrane and to the GO humidity, which for example makes NCM a good membrane in order to easily release the GO. In some experiments, the transfer remained perfectly effective after one month by simple rewetting of the NCM.

The method exploits the versatility of the vacuum filtration technique, the ability to shape the porous membrane by mask printing, and the weakness of the van der Waals interactions between the electronic material and the membrane (the van der Waals interactions are stronger between the electronic material and the flexible substrate) to create a simple printing process for industrial manufacturing of electronic devices (possibly transparent, see below), for example multielectrode arrays, and achieves a synergy between the three technologies.

This electrode-printing technology is advantageous over known fabrication methods in terms of ease, cost and applications. For example, it does neither require the use of a clean room nor of acetone dissolvent. Regarding the applications, it paves the way to ready, low-cost industrial fabrication of sensors and biosensors, and to 3D architectures.

The patterned electronic device needs not be electrically conductive. For example, oGO is not conductive but its reduced form, rGO, is conductive. An electronic structure made of oGO can be used as an insulator or a semiconductor; and doped, but not reduced, oGO can be used as a LED.

As already mentioned, the porous membrane can be made of nitrocellulose, but other materials such as PTFE, paper, etc, may also be used.

Depending on the electronic and membrane materials, the size of the pore may be between 0.01 µm and 0.3 µm, more precisely between 0.015 µm and 0.1 µm, and preferably between 0.02 µm and 0.03 µm in the case of graphene oxide.

As mentioned above, the printing material of the hydrophobic mask may be a wax, but other hydrophobic polymers commonly used in inkjet and screen printing technologies may also be used.

The flexible substrate may be organic, for example polyethylene terephthalate (PET).

In an example, the transfer step may be performed with a press, exerting a force of, for example, between 500 kg and 700 kg. The press may actuate through a stamp to which the flexible substrate is adhered.

In an example, the flexible substrate may be a sheet, e.g. a continuous sheet, and the transfer step may be performed with roll-to-roll hardware, in which case the printer for printing the hydrophobic mask may be integrated with the roll-to-roll hardware.

The method allows for great versatility and, for instance, the electronic device may be an interdigitated electrode, circular or otherwise, or an electrode microarray.

The electronic device may be transparent or translucent. For example, in the case of graphene oxide, a decrease in rGO concentration causes a gain in transparency because transparency is inversely proportional to the number of layers that have been transferred That is, if a higher GO concentration is filtered, a larger number of layers, and a bigger vertical height, is produced with the result of less transparency. So, by controlling the number of layers transferred, the thickness, and therefore the transparency of the electronic device, can also be controlled.

The present disclosure also contemplates an apparatus comprising an electronic device made with the above-disclosed method.

BRIEF DESCRIPTION OF THE DRAWINGS

Some examples of the present disclosure will be described in the following, only by way of a non-limiting example, with reference to the appended drawings, in which:

FIGS. 3a, 3b, 4a, 4b, 5a. 5b, 6a and 6b show examples of patterned electronic devices.

DETAILED DESCRIPTION OF THE EMBODIMENTS

Figure 1:
FIGS. 1a, 1b, 1c, 1d and 1e schematically show some steps of a method of forming a patterned electronic device on a flexible substrate.
Figure 1:
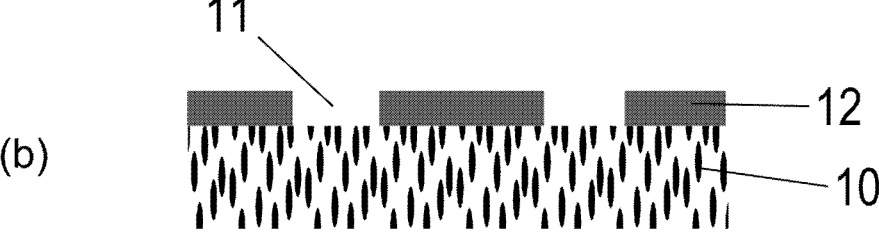
Figure 1:
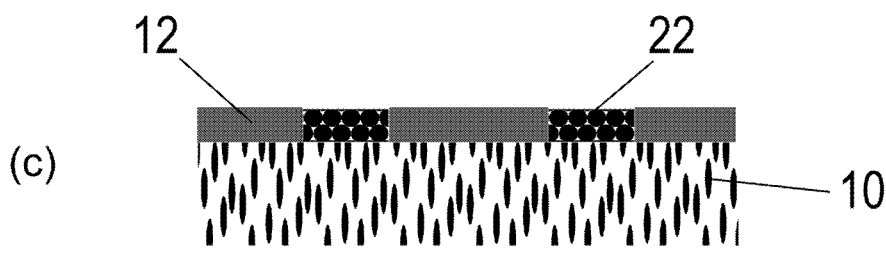
Figure 1:
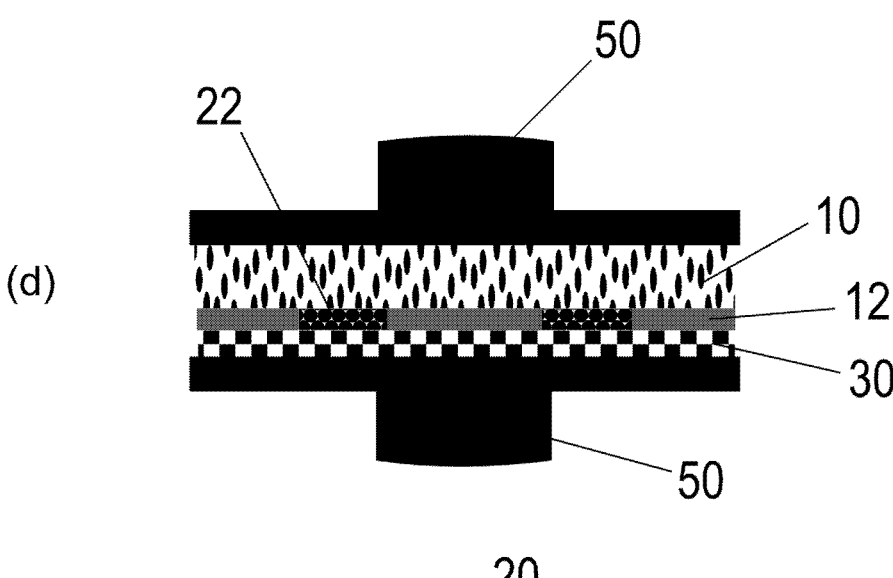
Figure 1:

With reference to FIG. 1, FIG. 1a represents a porous membrane 10, e.g. a hydrophilic nitrocellulose membrane (NCM) with a pore size of approximately 25 nm. FIG. 1b shows a hydrophobic mask 12 printed on the porous membrane, e.g. a wax-printed mask (WPM) with a height of approximately 25 μm. The mask 12 follows a pattern that is complementary to the pattern desired for an electronic device or structure 20 (see FIGS. 1b and 1e), and leaves corresponding openings 11 that reach the surface of the membrane 10.

FIG. 1c shows an electronic material 22 deposited on the non-printed region of the porous membrane 10, i.e. on the openings 11 left by the mask 12, as a consequence of the vacuum filtration of a suspension, e.g. an aqueous suspension, of the electronic material, e.g. non-conductive graphene oxide (oGO), through the porous membrane. That is, the liquid, e.g. water, is filtered through the membrane 10 and there is a deposition of electronic material 22 into the openings 11 (remember that the printed mask 12 is hydrophobic) and onto the non-printed region of the porous membrane. Since the printed mask 12 follows a pattern that is complementary to the pattern desired for the electronic device, the deposited electronic material 22 follows the desired pattern.

FIG. 1d shows the assembly of the porous membrane 10, the printed mask 12 and the electronic material 22 turned down and being pressed by a press stamp 50 (e.g. a PDMS stamp) against a flexible substrate 30, e.g. PET, exerting a force of for example 600 kg. The face of the assembly in contact with the substrate 30 is the face with the printed mask 12 and the electronic material 22 deposited on the openings 11 left by said mask.

FIG. 1e shows the electronic material transformed into an electronic device 20 transferred onto the flexible substrate 30 by virtue of the pressure exerted by the stamp 50, on account of the van der Waals interactions being weaker between the electronic material 22 and the porous membrane 10 than between the electronic material 22 and the flexible substrate 30 (see FIG. 1e).

Figure 2:
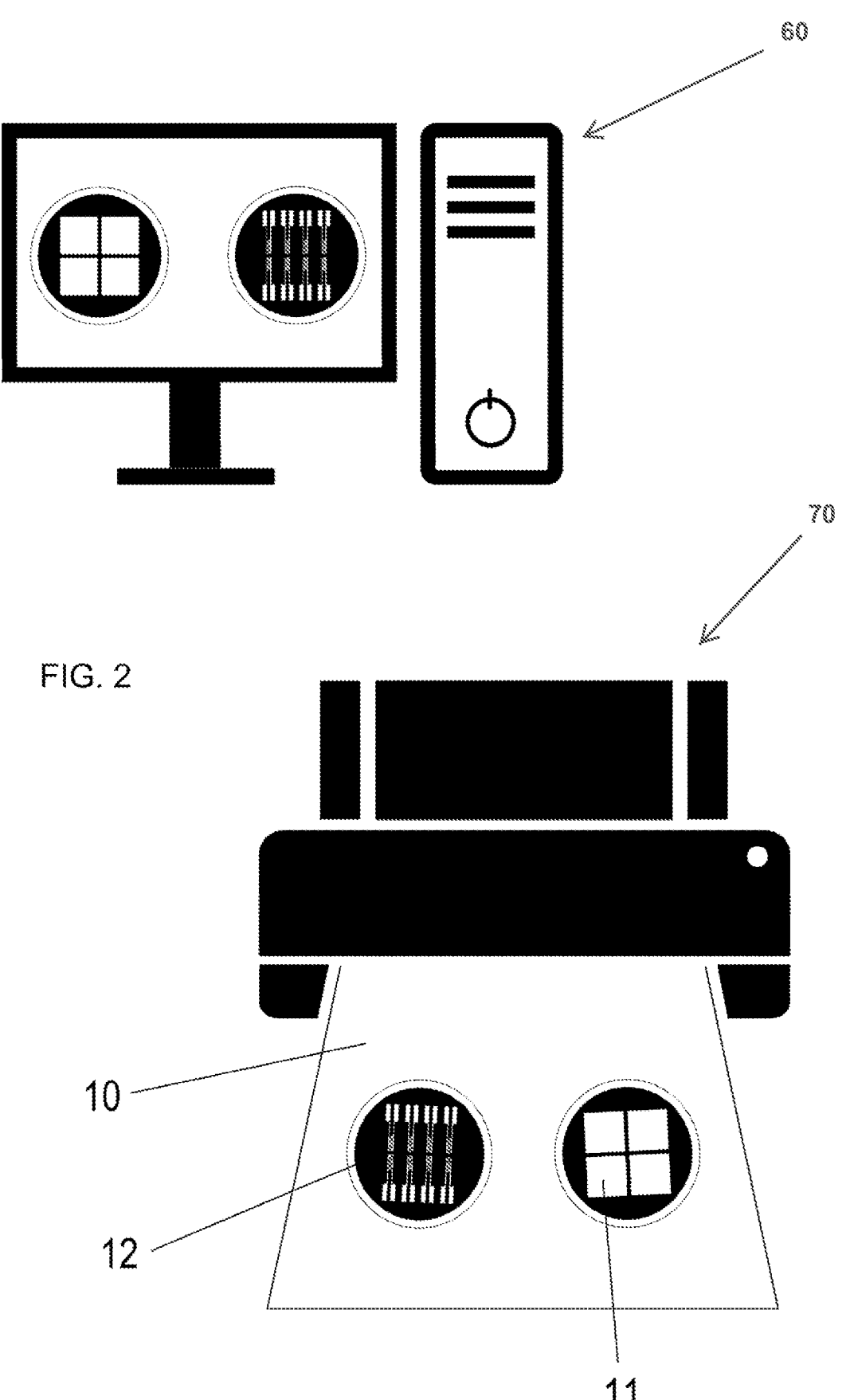
FIGS. 2a and 2b schematically show a printing step.

FIG. 2 shows the process of printing wax masks 12 with the aid of a computer 60 and a printer 70 (e.g. a Xerox ColourQube 8570 printer). The masks can be computer-designed and such designs can be wax-printed on nitrocellulose sheets 10. Openings 11 define the desired electrode pattern (the openings are the complement or "negative" of the mask).

FIG. 3a shows an example of a mask 121 printed on a porous membrane 101 and leaving some openings 111, and FIG. 3b shows an electronic device 201 that matches the openings 111, and thus is complementary to the mask 121, and has been transferred onto a flexible substrate 301. This is an example of square electrodes forming the electronic device 201.

Figure 4:
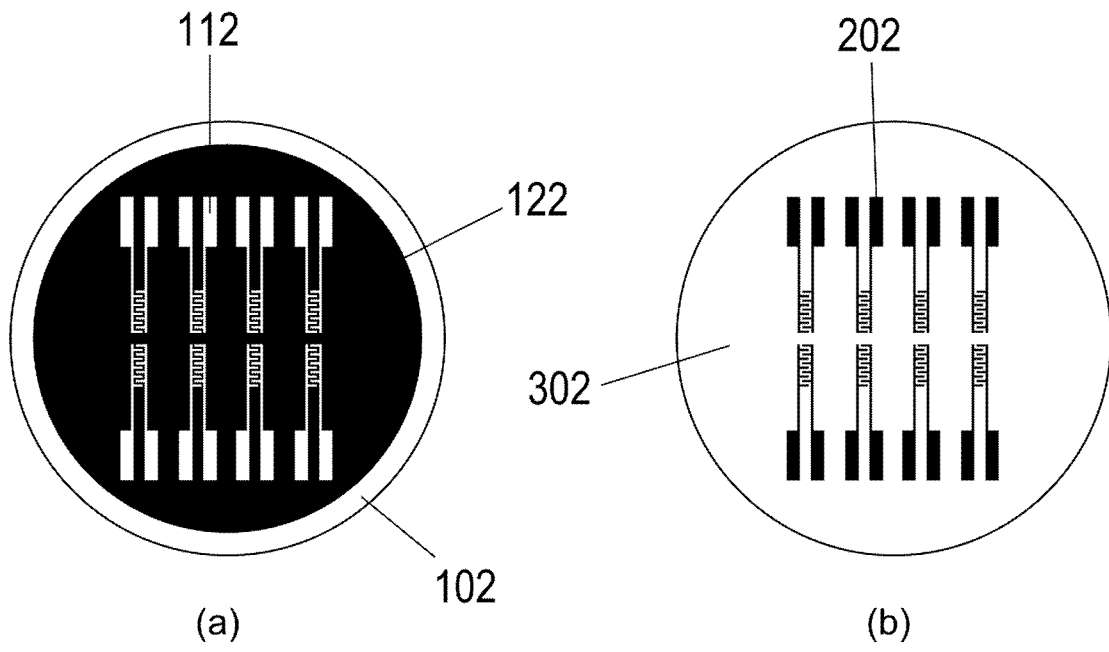

FIG. 4a shows an example of a mask 122 printed on a porous membrane 102 and leaving some openings 112, and FIG. 4b shows an electronic device 202 that matches the openings 112, and thus is complementary to the mask 122, and has been transferred onto a flexible substrate 302. This is an example of interdigitated electrodes forming the electronic device 202.

FIG. 5b shows an example of an electronic device 203 on a flexible substrate 303 and FIG. 5a shows a pair of corresponding electrodes in greater detail. This is an example of circular interdigitated electrodes forming the electronic device 203.

FIG. 6b shows an example of an electronic device 204 on a flexible substrate 304 and FIG. 6a shows a pair of corresponding electrodes in greater detail. This is an example of an electrode microarray forming the electronic device 204.

Naturally, the materials can vary from one example to another one, can be the same for some elements and different for others, or can be always the same for analogous elements. And there can be any suitable number of electrodes (or electronic components) formed on the flexible substrate or even different electrodes or components on the same substrate.

Regarding the method of forming a, for example, oGO structure on a, for example, organic substrate, the NCM is first patterned in the desired shape using a, for example, wax printer (FIG. 2) The areas to be printed are delineated by a binary color-coding scheme. The colored areas, assigned a positive value (or 1, in binary programming language), are destined for wax printing (see ref. 12 in FIG. 1b), whereas the uncolored areas, given a negative value (or 0), are left unprinted to subsequently serve as filters (openings 11). An aqueous suspension of oGO is poured onto the mask and then filtered through these uncovered areas 11.

The WPM is set onto a filtering glass and the suspension of oGO (at a desired concentration) is filtered, leaving an oGO mesh on top of the WPM (FIG. 1*c*). In related work, other groups had reported that the concentration and volume of the oGO suspension strongly influence the filtration rate. However, in this case a reduction in the filtration area led to a strong decrease in pressure and, consequently, to a much slower filtration. Therefore, it was decided to simply remove the unfiltered oGO, instead.

The WPM topped with oGO 22 is placed onto the substrate 30 and the assembly is subjected to vertical pressure (FIG. 1*d*), which leaves a patterned oGO device or structure 20 (e.g. electrodes) on the substrate surface (FIG. 1*e*). It is hypothesized that the transfer involves two related steps: expulsion of the oGO from the WPM and attachment of it to the substrate surface. The inventors believe that the expulsion occurs by simple air/humidity pressure and that the attachment is favored by van der Waals forces, as the reported values at the oGO/NCM interface are lower than those at the oGO/substrate interface.

Additionally, as proof of concept of a technique that is presently considered amenable to specialized technologies, a wax printer outfitted with roll-to-roll hardware was used to transfer shaped oGO onto a PET substrate. The roll-to-roll machinery can be used for feeding substrate sheets into the printer and for printing the wax, and must apply sufficient pressure to transfer the oGO. This method offers strong potential for simple, fast printing of this class of oGO devices on an industrial scale.

The lateral height of the WPMs was measured and their long-term stability was assessed. The direction of the wax printing (horizontal or vertical) was an important parameter to evaluate, as it affects the resolution and the shape of the lines edges. The best resolution was obtained when the line was printed vertically, as it did not lead to any systematic curves on the border. Different wax mask shapes were also evaluated. All the masks shown (FIGS. 3*a* and 4*a*), or implied (FIGS. 5 and 6), in the figures exhibited acceptable designs over a range of 200 to 300 µm, which is consistent with literature values for printing onto paper or NCM. The transversal cut of the WPM shows a medium height of circa 25 µm. The change in lateral spreading of the wax across the WPM at room temperature was studied over 5 months and no significant deformation or spreading was observed. It is, therefore, concluded that these WPMs are stable over the long term.

The wax-printing method has been used to create various different masks for printing oGO devices or platforms (FIGS. 3 to 6). In the general procedure, a WPM is first laid onto the filtering glass and 5 mL of an aqueous suspension of oGO (0.1 mg/mL) is then filtered through it for 5 min. The unfiltered oGO solution is removed (and can later be reused), leaving behind an oGO mesh 22 on top of the membrane 10, as represented in FIG. 1*c*. The concentration, volume and filtering time of the oGO suspension each depend on the filtering pressure and can be adjusted according to the requirements of the desired end application. This methodology is faster than previously reported methods and is also controllable.

Reduced graphene oxide (rGO) is a conductor and can be obtained by reducing the corresponding oGO products with hydrazine vapor.

The present WPM method and subsequent reduction can be used to pattern various types of electronic devices, like generic interdigitated electrodes (IDEs, FIG. 4), circular IDEs (FIG. 5), or multiarray microelectrode systems amenable to multidetection applications (FIG. 6).

Figure 3:
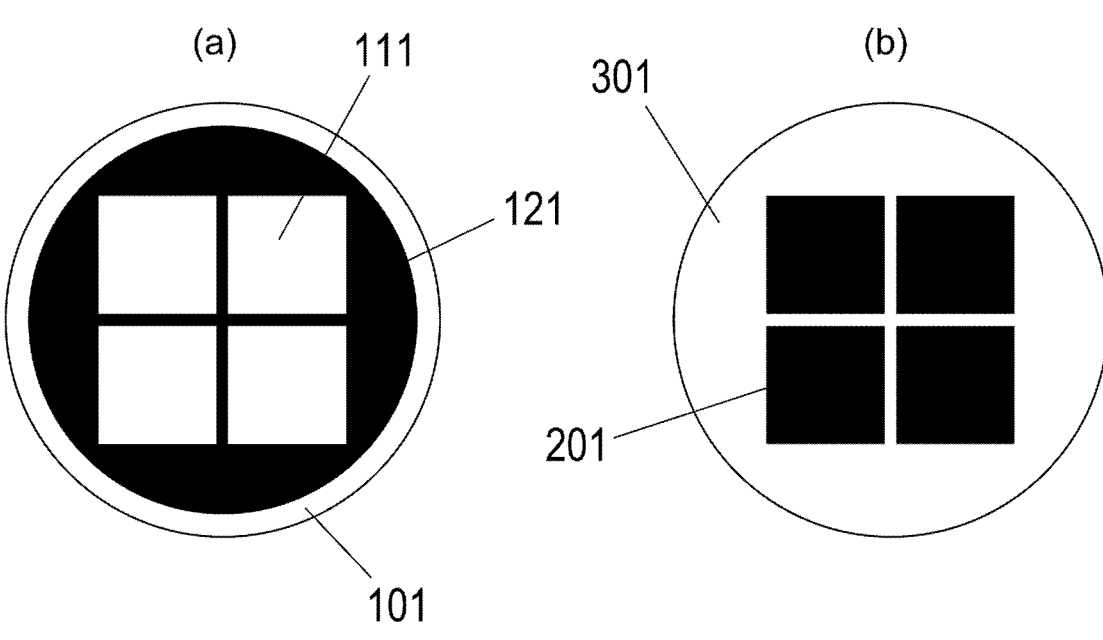

In FIG. 3, four squares 201 of oGO are patterned onto a PET film 301, and then reduced to make them conductive. Next, several 300-µm circles of oGO can be created and then transferred onto the rGO squares on the film, leaving behind circular oGO patterns to build up an integrated system wired by inkjet printing of silver ink. Such architecture enables conjugation of diverse nanomaterials and/or biomaterials to the device and further exploitation of the properties of oGO. SEM (Scanning Electron Microscope) images of the (transparent) electronic devices show that the oGO transfer is efficient and that the shapes are well defined.

The EIS (Electrochemical Impedance Spectroscopy) response of the generic IDEs 202 of FIG. 4*b* deposited onto different flexible substrates 302 (e.g. glass, PEN, PET, cellulose acetate, plastic adhesive film, wax-modified paper, etc) shows an interesting behavior for applications in a myriad fields, including biosensing and energy (e.g. solar cells). The obtained results open the door to diversely functionalized flexible and transparent rGO electrodes. The EIS responses of the generic IDEs printed onto different flexible materials vary in their electrode-electrolyte interface impedance (EEII), which can be attributed to the differences in surface roughness, flexibility and hydrophobicity of the respective substrates, as these factors would have influenced the morphology of the printed oGO. The PEN and flexible glass present the lowest EEII, whereas the plastic adhesive film and the cellulose acetate offer the highest values.

However, PET offered the best trade-off in terms of cost, transparency and flexibility, and it was chosen for further studies on the influence of oGO concentration on IDE performance (as measured by EIS). An increase in oGO concentration correlated to a decrease in EEII and therefore, to an increase in conductivity of rGO, consistently with literature reports. This trend was indirectly confirmed by performing AFM (Atomic Force Microscopy) studies on analogous glass IDEs, since PET, because of its roughness, is not very suitable for nanometric AFM measurements.

In summary, the present disclosure reports a new, versatile and customizable method for patterning oGO onto flexible substrates through highly stable, microscale WPMs. These masks enable controlled printing of oGO in various shapes of interest for different applications. The oGO-printing technology reported here is advantageous over previously reported methods for fabrication of GO-based devices in terms of ease, cost and potential end-applications: for instance, it does not require the use of a clean room. It should ultimately pave the way to ready, low-cost industrial fabrication of a broad array of GO-based devices such as sensors and biosensors.

Although only particular embodiments of the invention have been shown and described in the present specification, the skilled man will be able to introduce modifications and substitute any technical features thereof with others that are technically equivalent, depending on the particular requirements of each case, without departing from the scope of protection defined by the appended claims.

For example, although the electronic devices are represented as black in the drawings, they can be transparent or translucent.

The invention claimed is:

1. A method of forming an electronic device on a flexible substrate, wherein the flexible substrate is a sheet, the method comprising the steps of:

wax printing a hydrophobic mask on a porous membrane to form a pattern thereon which is complementary to a desired pattern;

filtering an aqueous suspension consisting of water and an electronic material, wherein the electronic material is graphene oxide, through a non-printed region of the porous membrane, wherein some electronic material is deposited on the non-printed region following the desired pattern; and transferring the patterned electronic material to the sheet by a transfer step consisting of pressing the sheet against the printed face of the porous membrane with a press, enabling the transfer of the patterned electronic material deposited on the porous membrane to the sheet to form the electronic device thereon;

wherein the transfer step of the method is carried out without using acetone dissolvent.

2. The method according to claim 1, wherein the electronic material is reduced graphene oxide.

3. The method according claim 1, wherein the porous membrane is made of nitrocellulose, a pore size thereof being between 0.01 μm and 0.3 μm.

4. The method according of claim 3, wherein the pressing step uses a pressing force of between 500 kg and 700 kg.

5. The method according to claim 1, wherein the sheet is organic.

6. The method according to claim 5, wherein the sheet is polyethylene terephthalate (PET).

7. The method of claim 5, wherein the sheet is a continuous sheet and the pressing step is performed with roll-to-roll hardware.

8. The method according to claim 7, wherein the hydrophobic mask is printed with a printer which is integrated with the roll-to-roll hardware.

9. The method according to claim 1, wherein the press actuates through a stamp to which the sheet is adhered.

10. The method according to claim 1, wherein the electronic device is an interdigitated electrode.

11. The method according to claim 1, wherein the electronic device is transparent.

12. The method according to claim 1, wherein the pressing step uses a pressing force of between 500 kg and 700 kg.

13. The method according to claim 1, wherein the electronic material is oxidized graphene oxide.

14. The method according to claim 1, wherein the electronic device is an electrode microarray.

15. The method according claim 1, wherein the porous membrane is made of nitrocellulose, a pore size thereof being between 0.01 μm and 0.1 μm.

16. The method according of claim 15, wherein the pressing step uses a pressing force of between 500 kg and 700 kg.

* * * * *